United States Patent
Shenoy

(10) Patent No.: US 6,737,731 B1
(45) Date of Patent: May 18, 2004

(54) SOFT RECOVERY POWER DIODE

(75) Inventor: Praveen Muraleedharan Shenoy, Wilkes-Barre, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/603,605

(22) Filed: Jun. 26, 2000

(51) Int. Cl.$^7$ ............... H01L 31/075; H01L 29/167; H01L 29/36
(52) U.S. Cl. ............... 257/656; 257/655; 257/927
(58) Field of Search ............... 257/101, 219–221, 257/269, 285, 335–345, 655–657, 927, 929

(56) References Cited

U.S. PATENT DOCUMENTS

| | | | |
|---|---|---|---|
| 4,228,453 A | 10/1980 | Pearsall | 357/60 |
| 4,594,602 A | 6/1986 | Iimura et al. | 357/13 |
| 4,954,850 A | * 9/1990 | Kasahara | 357/14 |
| 5,017,950 A | * 5/1991 | Kasahara | 357/14 |
| 5,032,540 A | 7/1991 | Follegot | 437/142 |
| 5,323,029 A | * 6/1994 | Nishizawa | 257/136 |
| 5,608,244 A | 3/1997 | Takahashi | 257/267 |
| 5,773,858 A | 6/1998 | Schlangenotto et al. | 257/212 |
| 5,811,873 A | 9/1998 | Soejima | 257/655 |
| 5,977,611 A | 11/1999 | Sittig et al. | 257/603 |

FOREIGN PATENT DOCUMENTS

| | | | |
|---|---|---|---|
| EP | 0103138 | 3/1984 | H01L/29/91 |
| EP | 0614231 | 9/1994 | H01L/29/86 |
| EP | 0749166 | 12/1996 | H01L/29/861 |
| JP | 2000-323488 | * 11/2000 | H01L/21/329 |

OTHER PUBLICATIONS

Kaschani et al., "Soft recovery of power diodes by means of field controlled injection", *Solid State Electronics*, vol. 43, (1999) pp. 245–254.

Banerjee et al., *Design and Optimization of the Doping Profile of Double Drift Low–High–Low Indium Phosphide Diodes*, Semiconductor Science and Technology, Institute of Physics, London, GB, vol. 6, No. 7, Jul. 1, 1991, pp. 663–669.

* cited by examiner

*Primary Examiner*—Ori Nadav
(74) *Attorney, Agent, or Firm*—Allen, Dyer, Doppelt, Milbrath & Gilchrist, P.A.

(57) ABSTRACT

A semiconductor diode includes a first semiconductor layer including a dopant having a first conductivity type. A second semiconductor layer is adjacent the first semiconductor layer and includes a dopant having the first conductivity type and having a dopant concentration less than a dopant concentration of the first semiconductor layer. Adjacent the second semiconductor layer is a third semiconductor layer including a dopant having the first conductivity type and having a dopant concentration greater than the dopant concentration of the second semiconductor layer. A fourth semiconductor layer is adjacent the third semiconductor layer and includes a dopant of a second conductivity type. Respective contacts are connected to the first and fourth semiconductor layers.

41 Claims, 3 Drawing Sheets

SOFT RECOVERY POWER DIODE

FIELD OF THE INVENTION

The present invention relates to the field of electronic devices, and, more particularly, to power diodes.

BACKGROUND OF THE INVENTION

Diodes are used in a variety of circuits to either restrict or permit the flow of current within the circuit depending upon the voltage which is applied across the diode. That is, the voltage will either cause the diode to become forward-biased, at which point the current will flow through the diode, or reverse-biased, at which point current is restricted from flowing through the diode.

Diodes such as the P-i-N (positive-intrinsic-negative) diodes are widely used in high voltage applications, such as power factor correction circuits, for example. When such a diode transitions suddenly from a forward-biased state to a reversed-biased state caused by a large voltage swing, the diode must undergo a period of reverse recovery. During the forward-biased state the i region of the diode contains a large concentration of minority carriers. This concentration must be removed from the i region before the current flow can be limited to substantially zero. Accordingly, after being switched to, a reverse-biased state a reverse recovery current (Irr) will increase in magnitude until the excess carrier concentration at the P-N junction has dropped below the background concentration at a time t (i.e., the time when the current reaches a negative peak), at which point reverse recovery can begin.

If the minority carrier concentration becomes too large, it is possible that the Irr may increase to the point at which the circuit is damaged. Accordingly, it is desirable to have a low Irr to avoid this disadvantage. Yet, reducing the Irr results in an increase in the forward voltage drop (Vf) of the diode as well a decrease in the softness of the recovery waveform, both of which are undesirable. The softness of the recovery waveform corresponds to the slope of the Irr (i.e., dIrr/dt) as it tends toward zero after the time t. The steeper the slope, the less "soft" the recovery waveform and the greater the chance that ringing will result. Ringing is caused when the current overshoots or oscillates back and forth about zero during the reverse recovery period because the current increases and decreases too quickly due to circuit parasitics.

Accordingly, there is a need for a power diode that provides for a relatively low Irr value while maintaining a low Vf and soft recovery characteristics. Various attempts have been made in the prior art to create such diodes. One example is U.S. Pat. No. 4,594,602 to Iimura et al. entitled "High Speed Diode." The diode has a PNN<+>structure which is intended to provide high speed switching characteristics along with a soft reverse recovery and low forward voltage drop. However, the structure of this diode may not provide an adequate balance of reduced Irr and increased softness in certain applications.

SUMMARY OF THE INVENTION

In view of the foregoing background, it is therefore an object of the invention to provide a semiconductor diode having relatively low Irr and Vf values and further exhibiting soft recovery characteristics.

This and other objects, features, and advantages in accordance with the present invention are provided by a semiconductor diode including a more highly doped base layer between the intrinsic layer and the base. More particularly, the diode may comprise a first semiconductor layer that includes a dopant having a first conductivity type and a second semiconductor layer adjacent the first semiconductor layer that includes a dopant having the first conductivity type and having a dopant concentration less than a dopant concentration of the first semiconductor layer. Additionally, a third semiconductor layer maybe adjacent the second semiconductor layer and includes a dopant having the first conductivity type and having a dopant concentration greater than the dopant concentration of the second semiconductor layer. This third layer may be considered as providing the more highly doped base layer or region. A fourth semiconductor layer maybe adjacent the third semiconductor layer and include a dopant of a second conductivity type. Respective contacts are connected to the first and fourth semiconductor layers. The diode has a reduced Irr compared to prior art diodes yet still provides a low Vf and soft recovery characteristics.

The semiconductor diode may further include an intermediate semiconductor layer between the first semiconductor layer and the second semiconductor layer. The intermediate semiconductor layer has a dopant concentration between the dopant concentrations of the first and second semiconductor layers. Additionally, the fourth semiconductor layer may be surrounded by the third semiconductor layer.

By way of example, the dopant concentrations and thicknesses of the semiconductor layers may be as follows: for the first semiconductor layer, a dopant concentration in a range of about $1\times10^{18}$ to $1\times10^{19}$ cm$^{-3}$ and a thickness in a range of about 100 to 400 $\mu$m; a for the intermediate semiconductor layer, a dopant concentration in a range of about $2.5\times10^{14}$ to $1.3\times10^{15}$ cm$^{-3}$ and a thickness in a range of about 8 to 35 $\mu$m; for the second semiconductor layer, a dopant concentration in a range of about $6\times10^{13}$ to $6\times14^{14}$ cm$^{-3}$ and a thickness in a range of about 7 to 70 $\mu$m; for the third semiconductor layer, a dopant concentration in a range of about $1\times10^{14}$ to $1\times10^{16}$ cm$^{-3}$ and a thickness in a range of about 4 to 6 $\mu$m; and for the fourth semiconductor layer, a dopant concentration in a range of less than about $1\times10^{17}$ cm$^{-3}$ and a thickness in a range of about 2 to 4 $\mu$m.

In addition, the first conductivity type is preferably N type and the second conductivity type is preferably P type. Another aspect of the invention relates to doping-the fourth semiconductor region with relatively low concentrations compared to those found in prior art devices. Accordingly, the excess carrier concentration at the P-N junction between the third and fourth semiconductor layers is held to a lower level, thus resulting in a reduced Irr at the time t (hereafter "Irrm"). Increasing the doping concentration of the third semiconductor layer further reduces the carrier concentration at the P-N junction, providing for further reduction in the IrrM. The dopant concentration of the fourth semiconductor layer preferably has a dopant concentration greater than the dopant concentration of the third semiconductor layer. Furthermore, the dopant concentration may be chosen to cause an excess carrier concentration region away from the P-N junction during operation to be higher than in prior art devices, which serves to maintain Vf at low values and produce a soft recovery waveform.

A method according to the invention is for making a semiconductor diode. The method preferably includes providing a semiconductor substrate including a dopant having a first conductivity type. A first epitaxial layer of the first conductivity type is grown adjacent the semiconductor substrate and may have a dopant concentration less than a dopant concentration of the first semiconductor layer. The method may further include doping a first region of the first conductivity type in the first epitaxial layer to a dopant concentration less than the dopant concentration of the first epitaxial layer, and doping a second region of a second conductivity type in the first region. Additionally, respective contacts maybe formed on the semiconductor substrate and the second region.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
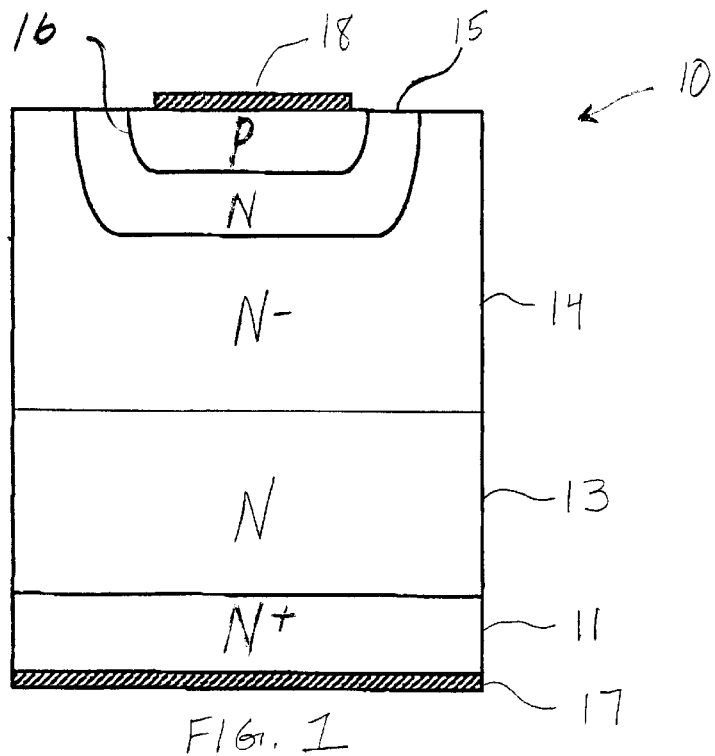
FIG. 1 is a schematic cross-sectional view of a semiconductor diode according to the present invention.

Referring now to FIG. 1, a diode 10 according to the invention is first described. The diode 10 includes a first semiconductor layer or substrate 11 that illustratively includes an N-type dopant. An intermediate semiconductor layer 13 (N-type) is formed between the first semiconductor layer 11 and a second semiconductor layer 14, which is also N-type. The dopant concentration of the intermediate semiconductor layer 13 is less than that of first semiconductor layer 11, and the dopant concentration of the second semiconductor layer 14 is less than that of the intermediate semiconductor layer. The intermediate and second semiconductor layers 13, 14 may be epitaxially grown on the substrate, for example, as will be readily appreciated by those skilled in the art.

A third semiconductor layer 15 is adjacent the second semiconductor layer 14 and includes an N-type dopant of a concentration greater than the second semiconductor layer. Adjacent the third semiconductor layer is a fourth semiconductor layer 16 which includes a P-type dopant. Both the third and fourth semiconductor layers 15, 16 may be doped by conventional diffusion or implantation techniques, for example, as will be readily appreciated by those of skill in the art. As shown in FIG. 1, the fourth semiconductor layer 16 may be surrounded by the third semiconductor layer 15. A metal contact layer (or cathode) 17 is formed on the first semiconductor layer 11 and a metal contact layer (or anode) 18 is formed on the fourth semiconductor layer 16. A shallow, lightly activated P+ surface implant may be included to provide better contact between the fourth semiconductor layer 16 and the anode 18. The implant layer is only lightly activated to keep the injection efficiency at the P-N junction low.

According to the present invention, the dopant concentrations of the above layers are chosen to minimize carrier concentration around the P-N junction between the third and fourth semiconductor layers 15, 16 to thereby lower IrrM. This can be achieved in two ways. First, the doping concentration of the third semiconductor layer 15 may be higher than the doping concentration of the second layer 14. Secondly, the doping concentration of the fourth semiconductor layer 16 may be decreased relative to prior art devices, providing the same effect. That is, by reducing the injection efficiency of the P type injector the excess carrier concentration at the P-N junction may be lowered. By doing both, an even greater reduction in Irr levels may be obtained, as will be discussed further below.

As noted above, reducing IrrM normally leads to an increase in Vf and a loss of softness in the recovery waveform. To alleviate such results, the dopant concentrations are chosen to cause an excess carrier concentration region to be formed away from the P-N junction during operation, which serves to maintain Vf at low values and produce a soft recovery waveform. That is, even though the maximum recovery value (i.e., the point at which dIrr/dt equals zero) is reduced because a lower carrier concentration is present at the P-N junction, the overall carrier concentration of the semiconductor diode 10 may be maintained due to the higer excess carrier concentration region away from the P-N junction, which allows Vf to remain low. Also, since the maximum recovery value is lower, the time it takes the reverse recovery current to reach this point will decrease. Yet, since the carrier concentration across the entire semiconductor diode 10 remains substantially the same as in prior art diodes, the total time required for recovery will basically remain unchanged. Thus, the slope of the recovery curve after the maximum recovery value (i.e., after time t) will be less steep, resulting in increased softness.

Exemplary expected ranges for the thicknesses (in $\mu$m) and doping concentrations (in $cm^{-3}$) of the above described layers for representative diodes of 300, 600, and 1200 volts are provided in Table 1 and Table 2, respectively, below. Those of skill in the art will appreciate that the above advantages may be implemented in a variety of diodes having a variety of operating voltages other than those provided in these tables. Layer numbers refer to the reference numeral given above for the respective layer.

TABLE 1

| | Thicknesses | | |
|---|---|---|---|
| Layer | 300 V | 600 V | 1200 V |
| 11 | 100–400 $\mu$m | 100–400 $\mu$m | 100–400 $\mu$m |
| 13 | 8–10 $\mu$m | 25–30 $\mu$m | 30–35 $\mu$m |
| 14 | 7–9 $\mu$m | 25–30 $\mu$m | 60–70 $\mu$m |
| 15 | 4–6 $\mu$m | 4–6 $\mu$m | 4–6 $\mu$m |
| 16 | 2–4 $\mu$m | 2–4 $\mu$m | 2–4 $\mu$m |

TABLE 2

| | Doping Concentrations | | |
|---|---|---|---|
| Layer | 300 V | 600 V | 1200 V |
| 11 | $1 \times 10^{18}$ – $1 \times 10^{19}$ $cm^{-3}$ | $1 \times 10^{18}$ – $1 \times 10^{19}$ $cm^{-3}$ | $1 \times 10^{18}$ – $1 \times 10^{19}$ $cm^{-3}$ |
| 13 | $1 \times 10^{15}$ – $1.3 \times 10^{15}$ $cm^{-3}$ | $5 \times 10^{14}$ – $7 \times 10^{14}$ $cm^{-3}$ | $2.5 \times 10^{14}$ – $3 \times 10^{14}$ $cm^{-3}$ |
| 14 | $5 \times 10^{14}$ – | $1 \times 10^{14}$ – | $6 \times 10^{13}$ – |

TABLE 2-continued

Doping Concentrations

| Layer | 300 V | 600 V | 1200 V |
|---|---|---|---|
| 15 | $6 \times 10^{14}$ cm$^{-3}$ $1 \times 10^{15}$ – $1 \times 10^{16}$ cm$^{-3}$ | $1.2 \times 10^{14}$ cm$^{-3}$ $2 \times 10^{14}$ – $4 \times 10^{15}$ cm$^{-3}$ | $7 \times 10^{13}$ cm$^{-3}$ $1 \times 10^{14}$ – $3 \times 10^{15}$ cm$^{-3}$ |
| 16 | $<1 \times 10^{17}$ cm$^{-3}$ | $<1 \times 10^{17}$ cm$^{-3}$ | $<1 \times 10^{17}$ cm$^{-3}$ |

Figure 2:
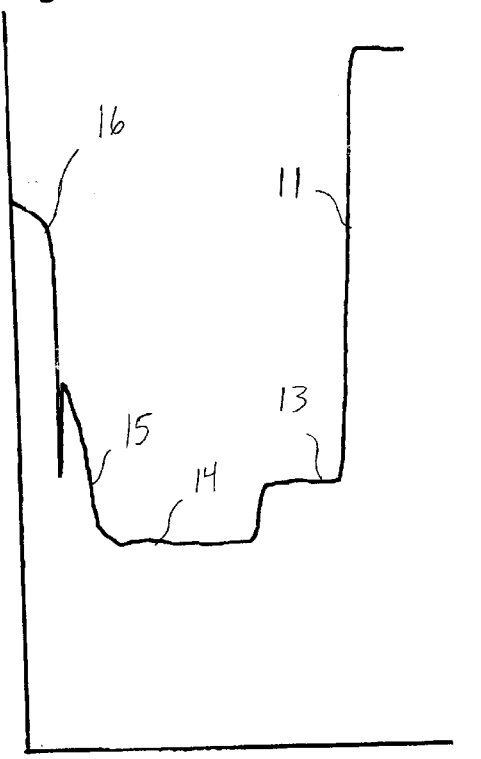
FIG. 2 is a graph illustrating a doping profile of the semiconductor diode of FIG. 1.

An exemplary dopant profile of the semiconductor diode 10 of FIG. 1 is shown in FIG. 2. The reference numbers again correspond to the above described layers. One noteworthy point illustrated by the profile is that the dopant concentration of the fourth semiconductor layer 16 is chosen to be greater than the dopant concentration of the third semiconductor layer 15. Additionally, the depth of the fourth semiconductor layer 16 is less than corresponding P-layers of prior art P-N diodes, which are typically about 8 µm. Furthermore, the dopant concentration of the fourth semiconductor layer 16 is also less than that of prior art diodes, as will be appreciated by those of skill in the art. Accordingly, the total charge of the semiconductor layer 16 is reduced to thereby provide a lower injection efficiency at the P-N junction than in prior art diodes.

Figure 3:
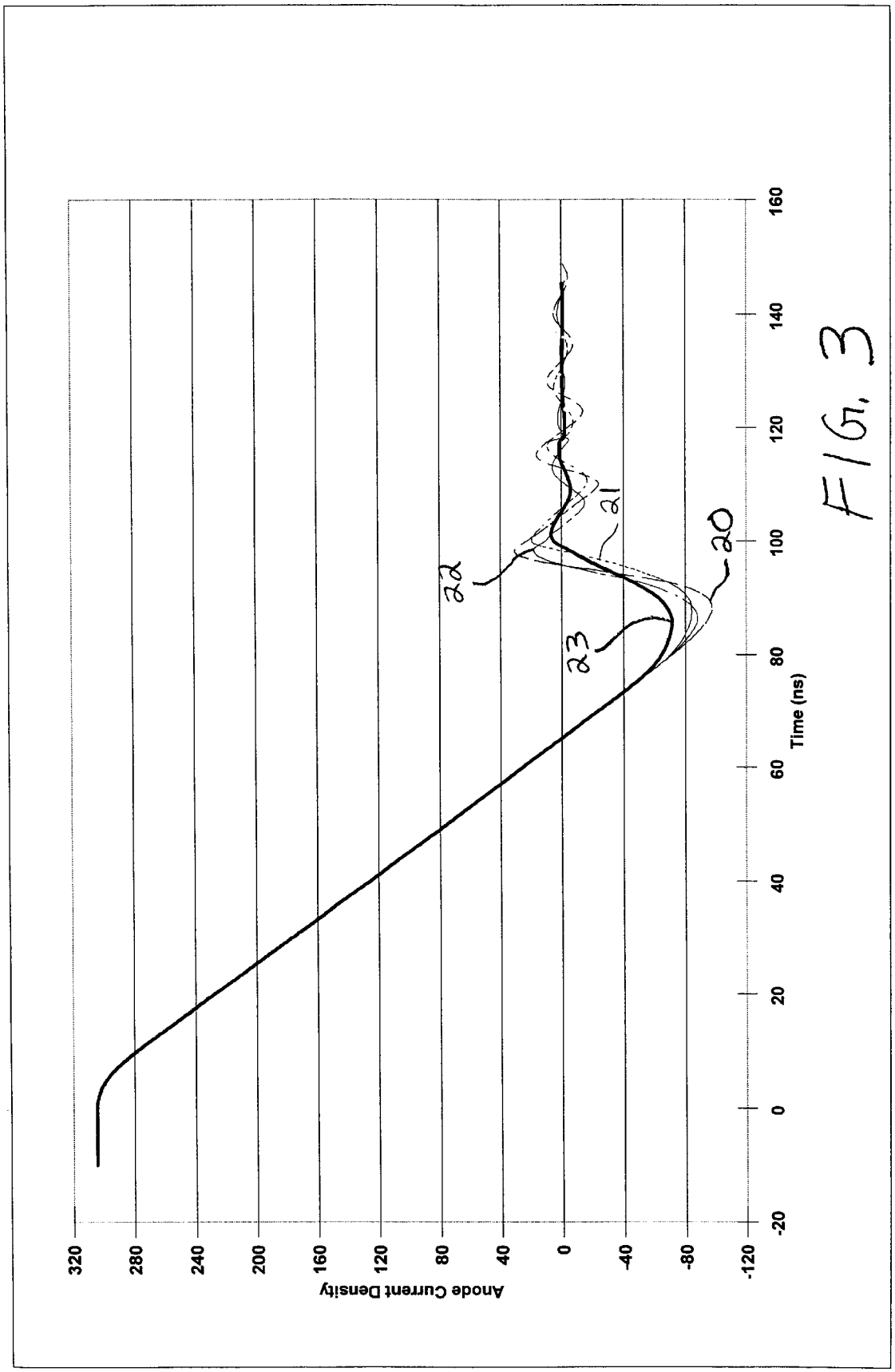
FIG. 3 is a graph illustrating simulated test results of the recovery waveforms of a prior art diode and several embodiments of diodes according to the present invention.

The efficacy of the present invention has been demonstrated in both simulations and actual tests. Turning now to FIG. 3, the simulated recovery waveforms of four different 600V diodes are illustrated. The first waveform 20 corresponds to a prior art Hyperfast diode made by the assignee of the present invention. The second waveform 21 corresponds to a diode made according to the present invention having a third semiconductor layer 15 with an increased dopant concentration (as described in Table 2, above) and a conventionally doped fourth semiconductor layer 16. The third waveform 22 corresponds to a diode made according to the present invention having a fourth semiconductor layer 16 with a decreased dopant concentration (again described in Table 2) and a conventionally doped third semiconductor layer 15. Finally, the fourth waveform 23 corresponds to a diode made according to the present invention having both a third semiconductor layer 15 with an increased dopant concentration and a fourth semiconductor layer 16 with a decreased dopant concentration.

Each of the simulated diodes according to the present invention (i.e., waveforms 21, 22, 23) provide lower Irr values and increased softness. Specifically, the Irr of the diodes corresponding to waveforms 21, 22 were approximately 9 and 14% lower, respectively, than the Irr of the prior art diode corresponding to waveform 20. Furthermore, the diode corresponding to waveform 23 provided an approximate 27% drop in Irr as well as an approximate 75% increase in softness with respect to the prior art diode. These values were obtained while maintaining Vf at about 1.8±0.05 volts for each of the diodes.

Figure 4:
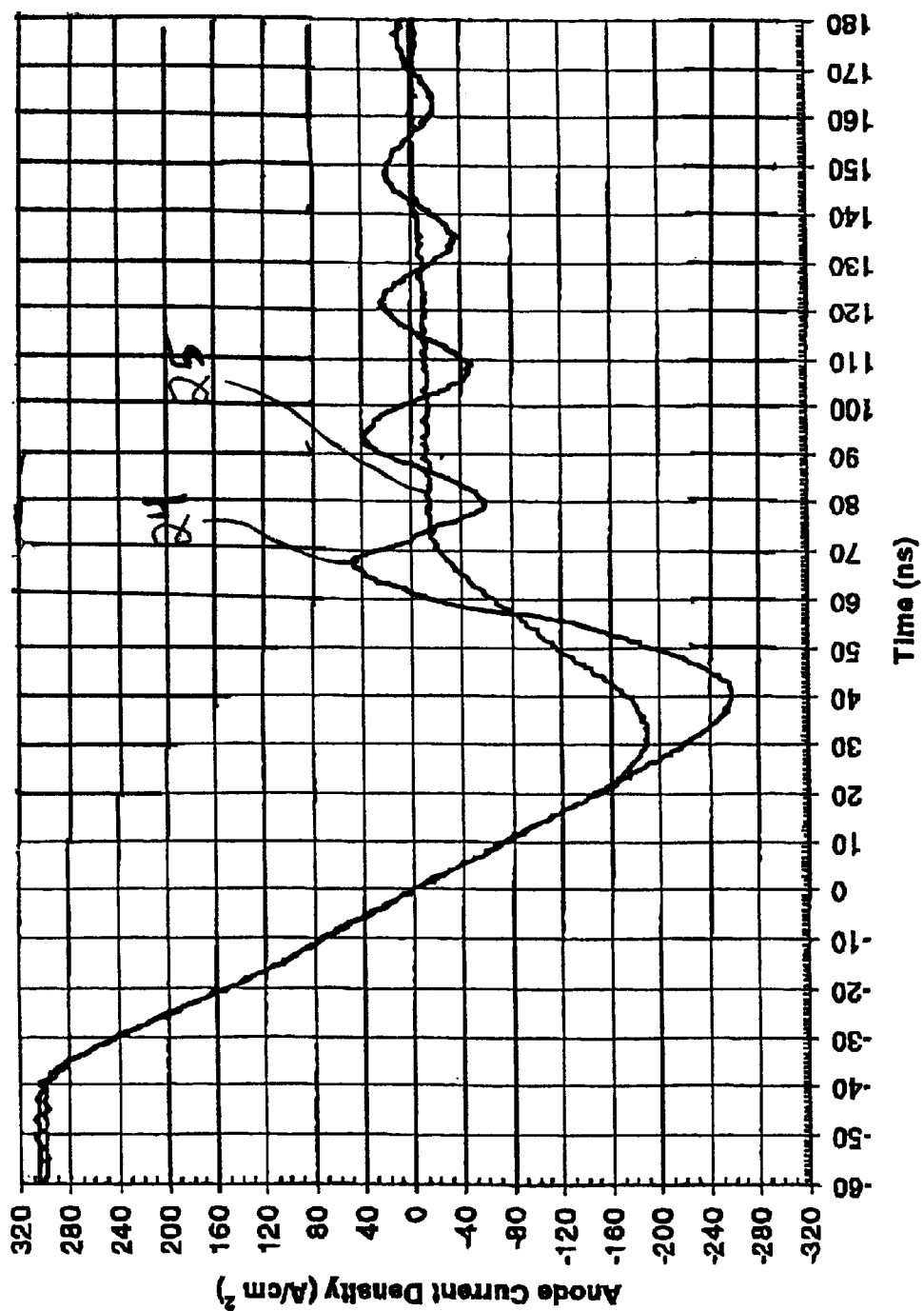
FIG. 4 is a graph illustrating actual test results of the recovery waveforms of a prior art diode and a diode according to the present invention.
Figure 2:
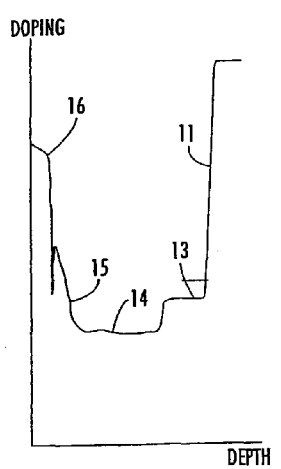
Figure 1:
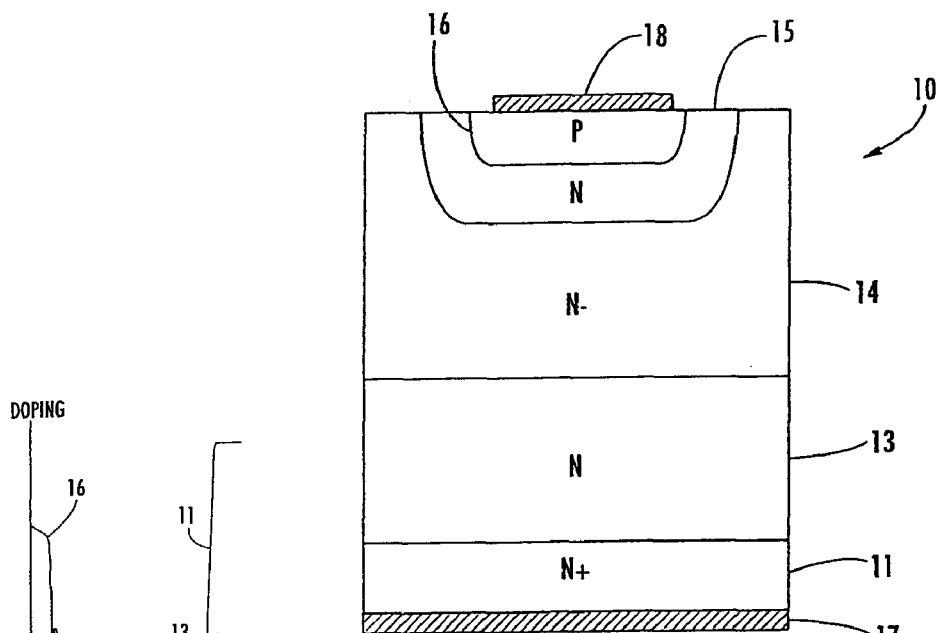
Figure 3:
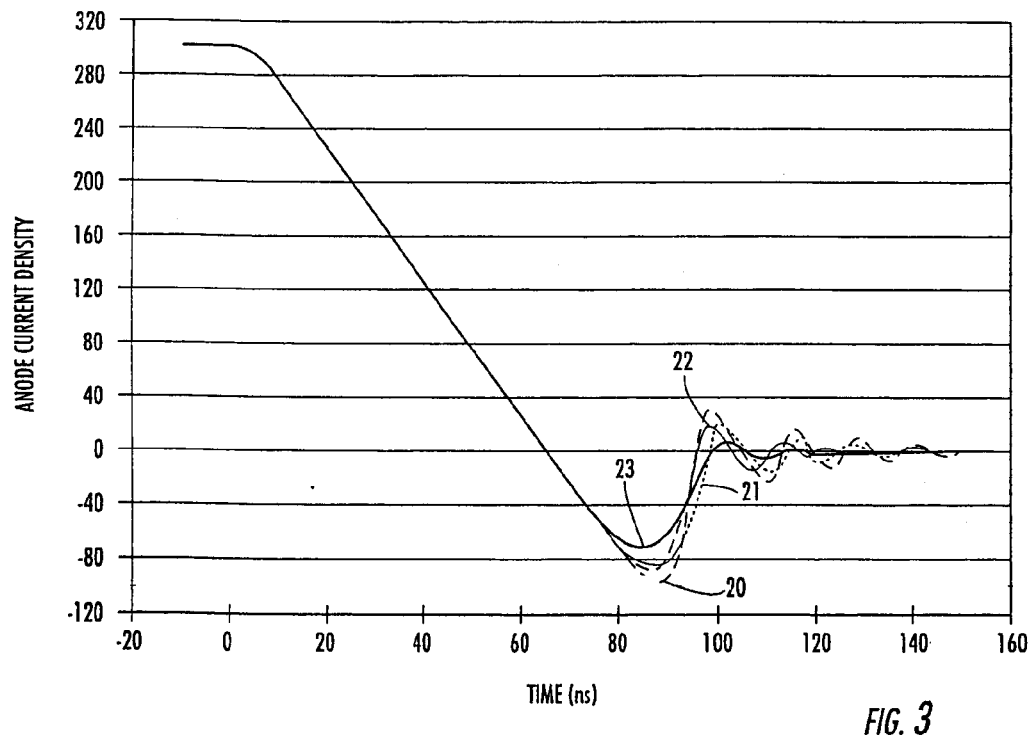
Figure 4:
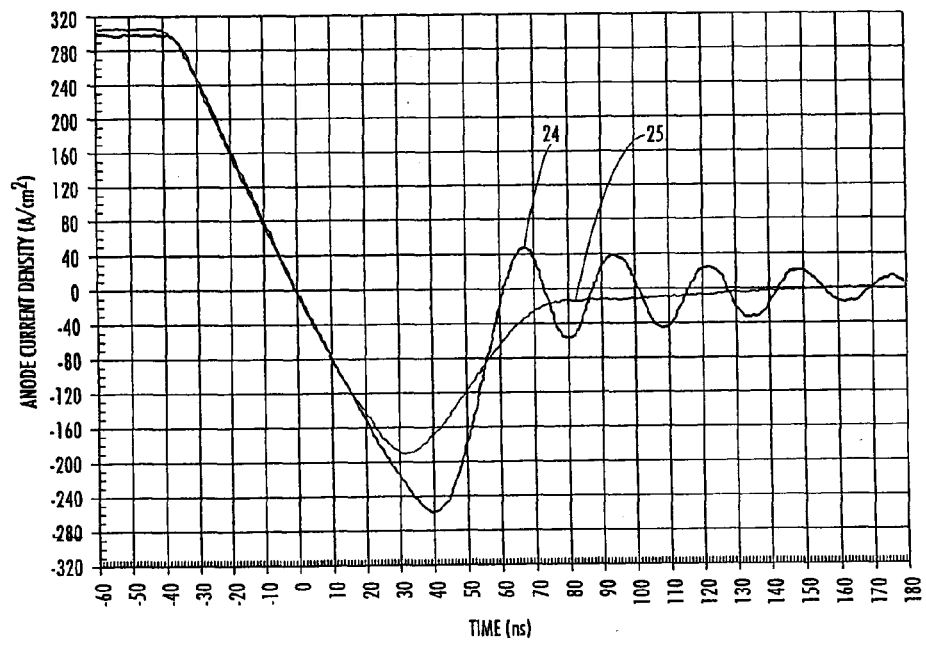

Referring now to FIG. 4, actual test results comparing the above prior art Hyperfast diode to a diode according to the invention having both a third semiconductor layer 15 with an increased dopant concentration and a fourth semiconductor layer 16 with a decreased dopant concentration are shown. The waveform 24 corresponds to the prior art diode and the waveform 25 corresponds to the diode of the present invention. Again, it can be seen that the Irr for the diode of the present invention is lower than that of the prior art diode (by approximately 26%). Most notably, an increase in softness of approximately 130% was realized, resulting in substantially no ringing. Again, by selecting dopant concentrations sufficient to cause an excess carrier concentration region as described above, the Vf value of the diode according to the present invention was maintained substantially the same as that of the prior art diode.

As will be appreciated by those skilled in the art, the third and fourth semiconductor layer 15, 16 of the diode 10, can be formed as doped regions in the upper portion of the second semiconductor layer 14. This can be done by conventional implantation or other doping techniques as will be appreciated by those skilled in the art. Accordingly, the power semiconductor diode 10 with its advantageous features can be readily made using an additional selective doping step to form the third semiconductor layer 15 (first doped region) as will be readily appreciated by those skilled in the art.

A method according to the invention is for making the semiconductor diode 10 and may include providing a doped semiconductor substrate 11 and growing epitaxial layers 13, 14 on the semiconductor substrate. The third layer or first region 15 is formed by doping an upper portion of the epitaxial layer 14, and the second region 16 may be formed by doping an upper portion of the first region. The contacts 17, 18 are also preferably formed on the semiconductor substrate 11 and the second region 16, respectively, as will be readily appreciated by those skilled in the art. The above layers are preferably formed having the dopant types and concentrations, thickness, etc. as set forth above.

It will also be appreciated by those skilled in the art that the present invention is not limited to any one type of diode. Rather, it may advantageously be used in all diodes including a P-N junction where a soft Irr waveform is desired, such as MOSFET body diodes, for example.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. A semiconductor diode comprising:

a first semiconductor layer including a dopant having a first conductivity type;

a second semiconductor layer adjacent said first semiconductor layer and including a dopant having the first conductivity type and having a dopant concentration less than a dopant concentration of said first semiconductor layer;

an intermediate semiconductor layer between said first semiconductor layer and said second semiconductor layer and in physical contact with said second semiconductor layer, said intermediate semiconductor layer including a dopant having the first conductivity type and having a dopant concentration between the dopant concentration of said first semiconductor layer and the dopant concentration of said second semiconductor layer;

a third semiconductor layer adjacent said second semiconductor layer and including a dopant having the first conductivity type and having a dopant concentration greater than the dopant concentration of said second semiconductor layer;

a fourth semiconductor layer in physical contact with said third semiconductor layer and including a dopant of a second conductivity type, said fourth semiconductor layer having a lower dopant concentration than the first semiconductor layer; and respective contacts connected to said first and fourth semiconductor layers.

2. The semiconductor diode of claim 1 wherein said fourth semiconductor layer has a dopant concentration greater than the dopant concentration of said third semiconductor layer.

3. The semiconductor diode of claim 1 wherein said third semiconductor layer has a thickness in a range of about 4 to 6 μm.

4. The semiconductor diode of claim 1 wherein the dopant concentration of said third semiconductor layer is in a range of about $1\times10^{14}$ to $1\times10^{16}$ cm$^{-3}$.

5. The semiconductor diode of claim 1 wherein said fourth semiconductor layer has a thickness of about 2 to 4 μm.

6. The semiconductor diode of claim 1 wherein said fourth semiconductor layer has a dopant concentration in a range of less than about $1\times10^{17}$ cm$^{-3}$.

7. The semiconductor diode of claim 1 wherein said fourth semiconductor layer is surrounded by said third semiconductor layer.

8. The semiconductor diode of claim 1 wherein said first semiconductor layer has a thickness in a range of about 100 to 400 μm.

9. The semiconductor diode of claim 1 wherein the dopant concentration of said first semiconductor layer is in a range of about $1\times10^{18}$ to $1\times10^{19}$ cm$^{-3}$.

10. The semiconductor diode of claim 1 wherein said second semiconductor layer has a thickness in a range of about 7 to 70 μm.

11. The semiconductor diode of claim 1 wherein the dopant concentration of said second semiconductor layer is in a range of about $6\times10^{13}$ to $6\times10^{14}$ cm$^{-3}$.

12. The semiconductor diode of claim 1 wherein said intermediate semiconductor layer has a thickness in a range of about 8 to 35 μm.

13. The semiconductor diode of claim 1 wherein the dopant concentration of said intermediate semiconductor layer is in a range of about $2.5\times10^{14}$ to $1.3\times10^{15}$ cm$^{-3}$.

14. The semiconductor diode of claim 1 wherein the first conductivity type is N type and the second conductivity type is P type.

15. A semiconductor diode comprising:

a first semiconductor layer including a dopant having a first conductivity type;

a second semiconductor layer adjacent said first semiconductor layer and including a dopant having the first conductivity type and having a dopant concentration less than a dopant concentration of said first semiconductor layer;

an intermediate semiconductor layer between said first semiconductor layer and said second semiconductor layer and in physical contact with said second semiconductor layer, said intermediate semiconductor layer including a dopant having the first conductivity type and having a dopant concentration between the dopant concentration of said first semiconductor layer and the dopant concentration of said second semiconductor layer;

a first doped region in said second semiconductor layer having the first conductivity type and having a dopant concentration greater than the dopant concentration of said second semiconductor layer;

a second doped region in said first doped region and in physical contact therewith having a second conductivity type, said second doped region having a lower dopant concentration than the first semiconductor layer; and respective contacts connected to said first semiconductor layer and said second doped region.

16. The semiconductor diode of claim 15 wherein said second doped region has a dopant concentration greater than the dopant concentration of said first doped region.

17. The semiconductor diode of claim 15 wherein said first doped region has a thickness in a range of about 4 to 6 μm.

18. The semiconductor diode of claim 15 wherein the dopant concentration of said first doped region is in a range of about $1\times10^{14}$ to $1\times10^{16}$ cm$^{-3}$.

19. The semiconductor diode of claim 15 wherein said second doped region has a thickness of about 2 to 4 μm.

20. The semiconductor diode of claim 15 wherein said second doped region has a dopant concentration in a range of less than about $1\times10^{17}$ cm$^{-3}$.

21. The semiconductor diode of claim 15 wherein said second doped region is surrounded by said first doped region.

22. The semiconductor diode of claim 15 wherein said first semiconductor layer has a thickness in a range of about 100 to 400 μm.

23. The semiconductor diode of claim 15 wherein the dopant concentration of said first semiconductor layer is in a range of about $1\times10^{18}$ to $1\times10^{19}$ cm$^{-3}$.

24. The semiconductor diode of claim 15 wherein said second semiconductor layer has a thickness in a range of about 7 to 70 μm.

25. The semiconductor diode of claim 15 wherein the dopant concentration of said second semiconductor layer is in a range of about $6\times10^{13}$ to $6\times10^{14}$ cm$^{-3}$.

26. The semiconductor diode of claim 15 wherein said intermediate semiconductor layer has a thickness in a range of about 8 to 35 μm.

27. The semiconductor diode of claim 15 wherein the dopant concentration of said intermediate semiconductor layer is in a range of about $2.5\times10^{14}$ to $1.3\times10^{15}$ cm$^{-3}$.

28. The semiconductor diode of claim 15 wherein the first conductivity type is N type and the second conductivity type is P type.

29. A semiconductor diode comprising:

a first semiconductor layer including a dopant having a first conductivity type;

a second semiconductor layer adjacent said first semiconductor layer and including a dopant having the first conductivity type and having a dopant concentration less than a dopant concentration of said first semiconductor layer;

an intermediate semiconductor layer between said first semiconductor layer and said second semiconductor layer and in physical contact with said second semiconductor layer, said intermediate semiconductor layer including a dopant having the first conductivity type and having a dopant concentration between the dopant concentration of said first semiconductor layer and the dopant concentration of said second semiconductor layer;

a first doped region in said second semiconductor layer having the first conductivity type and having a dopant concentration greater than the dopant concentration of said second semiconductor layer;

a second doped region in said first doped region and in physical contact therewith having a second conductivity type, said second doped region also having a dopant concentration greater than the dopant concentration of said first doped region and having a lower dopant concentration than the first semiconductor layer; and respective contacts connected to said first semiconductor layer and said second doped region.

30. The semiconductor diode of claim 29 wherein said first doped region has a thickness in a range of about 4 to 6 μm.

31. The semiconductor diode of claim 29 wherein the dopant concentration of said first doped region is in a range of about $1\times10^{14}$ to $1\times10^{16}$ cm$^{-3}$.

32. The semiconductor diode of claim 29 wherein said second doped region has a thickness of about 2 to 4 □m.

33. The semiconductor diode of claim 29 wherein said second doped region has a dopant concentration in a range of about to $1\times10^{17}$ cm$^{-3}$.

34. The semiconductor diode of claim 29 wherein said second doped region is surrounded by said first doped region.

35. The semiconductor diode of claim 29 wherein said first semiconductor layer has a thickness in a range of about 100 to 400 μm.

36. The semiconductor diode of claim 29 wherein the dopant concentration of said first semiconductor layer is in a range of about $1\times10^{18}$ to $1\times10^{19}$ cm$^{-3}$.

37. The semiconductor diode of claim 29 wherein said second semiconductor layer has a thickness in a range of about 7 to 70 μm.

38. The semiconductor diode of claim 29 wherein the dopant concentration of said second semiconductor layer is in a range of about $6\times10^{13}$ to $6\times10^{14}$ cm$^{-3}$.

39. The semiconductor diode of claim 29 wherein said intermediate semiconductor layer has a thickness in a range of about 8 to 35 μm.

40. The semiconductor diode of claim 29 wherein the dopant concentration of said intermediate semiconductor layer is in a range of about $2.5\times10^{14}$ to $1.3\times10^{15}$ cm$^{-3}$.

41. The semiconductor diode of claim 29 wherein the first conductivity type is N type and the second conductivity type is P type.

* * * * *

UNITED STATES PATENT AND TRADEMARK OFFICE
CERTIFICATE OF CORRECTION

PATENT NO. : 6,737,731 B1
DATED : May 18, 2004
INVENTOR(S) : Praveen Muraleedharan Shenoy It is certified that error appears in the above-identified patent and that said Letters Patent is hereby corrected as shown below:

Title page, Item [54] and Column 1, line 1,
Title, delete "SOFT RECOVERY POWER DIODE" insert -- SOFT RECOVERY POWER DIODE AND RELATED METHOD --

Drawings,
Delete informal drawings Sheets 1-3, (Figs. 1 to 4), and insert attached formal drawings Sheets 1-3 (Figs. 1 to 4)

Signed and Sealed this

Twelfth Day of October, 2004

JON W. DUDAS
*Director of the United States Patent and Trademark Office*